(12) United States Patent
Lin et al.

(10) Patent No.: US 8,178,410 B1
(45) Date of Patent: May 15, 2012

(54) METHOD FOR FABRICATING A SEMICONDUCTOR POWER DEVICE

(75) Inventors: Yung-Fa Lin, Hsinchu (TW); Shou-Yi Hsu, Hsinchu County (TW); Meng-Wei Wu, Hsinchu (TW); Main-Gwo Chen, Hsinchu County (TW); Jing-Qing Chan, Taipei (TW); Yi-Chun Shih, Nantou County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/171,368

(22) Filed: Jun. 28, 2011

(30) Foreign Application Priority Data

Apr. 21, 2011 (TW) .................................. 100113905

(51) Int. Cl.
*H01L 21/8236* (2006.01)
(52) U.S. Cl. .................. 438/276; 438/542; 257/E21.056

(58) Field of Classification Search .................. 438/206, 438/293, 524; 257/E21.056, E21.058, E21.14, 257/E21.419, E21.42
See application file for complete search history.

(56) References Cited

U.S. PATENT DOCUMENTS 6,794,698 B1 * 9/2004 Perng et al. .................... 257/296

* cited by examiner

*Primary Examiner* — Cheung Lee
(74) *Attorney, Agent, or Firm* — Winston Hsu; Scott Margo

(57) ABSTRACT

A method for forming a power device includes the following steps. An epitaxial layer is formed on a substrate. A pad layer and hard mask are formed on the epitaxial layer. A trench is etched into the hard mask, the pad layer, and the epitaxial layer. The hard mask is removed. A buffer layer is formed on the sidewall of the trench. The trench is then filled with a dopant source layer comprising plural dopants. A drive-in process is performed to diffuse the dopants into the epitaxial layer through the buffer layer, thereby forming a diffusion region around the trench.

18 Claims, 16 Drawing Sheets

METHOD FOR FABRICATING A SEMICONDUCTOR POWER DEVICE

BACKGROUND OF THE INVENTION

1. Field of the Invention

This present invention generally relates to the field of semiconductor power devices. More particularly, the present invention relates to a method for fabricating a power MOSFET with a super-junction.

2. Description of the Prior Art

A power device is mainly used in power management; for instance, being applied in a switching power supply, a management integrated circuit in the core or a peripheral region of computer, a backlight power supply, and in an electric motor control. The type of power devices described above include an insulated gate bipolar transistor (IGBT), a metal-oxide-semiconductor field effect transistor (MOSFET), and a bipolar junction transistor (BJT), among which the MOSFET is the most widely applied because of its energy saving properties and ability to provide faster switch speed.

In one kind of a power device, a P-type epitaxial layer and an N-type epitaxial layer are alternatively disposed to form several PN junctions inside a body and the junctions are vertical to a surface of the body. A structure with the described PN junctions is also called a super-junction structure. In a conventional method for fabricating the super-junction structure, an epitaxial layer of a first conductivity type, e.g. N-type, is formed on a substrate of the first conductivity type. Then, a plurality of trenches is etched into the first conductivity type epitaxial layer by a first mask. A second conductivity type epitaxial layer, e.g. P-type epitaxial layer, is filled into the trenches and the surface of the second conductivity type epitaxial layer is made level with the surface of the first conductivity type epitaxial layer. Hence, the trenches are filled with the second conductivity type epitaxial layer and are surrounded by the first conductivity type epitaxial layer. As a result, a super-junction structure with a plurality of PN junctions is formed.

The above-mentioned method still has many drawbacks, however. For instance, smooth surfaces cannot be obtained at the sidewall of the trenches via the etching process which may cause some defects on the interfacial surface between the first conductivity epitaxial layer and the second conductivity epitaxial layer. These defects reduce the breakdown voltage of the power device. In light of the above, there is still a need for fabricating a semiconductor power device with smooth super-junctions which are capable of overcoming the shortcomings and deficiencies of the prior art.

SUMMARY OF THE INVENTION

To address these and other objectives, the present invention provides a method for forming a power device. An epitaxial layer is formed on a substrate. Then a pad layer and a hard mask are formed on the epitaxial layer. At least a trench is etched into the hard mask, the pad layer, and the epitaxial layer. The hard mask is removed and a buffer layer is formed at the sidewall of the trench. The trench is then filled with a dopant source layer comprising plural dopants. A drive-in process is performed to diffuse the dopants into the epitaxial layer through the buffer layer, thereby forming a diffusion region around the trench.

In sum, the present invention provides a buffer layer between a dopant source layer and the sidewall of trenches to improve the distribution uniformity of dopants around the trenches after applying a drive-in process. The diffusion depths of the dopants near the sidewall are almost the same; therefore, the smooth PN junctions can be obtained.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
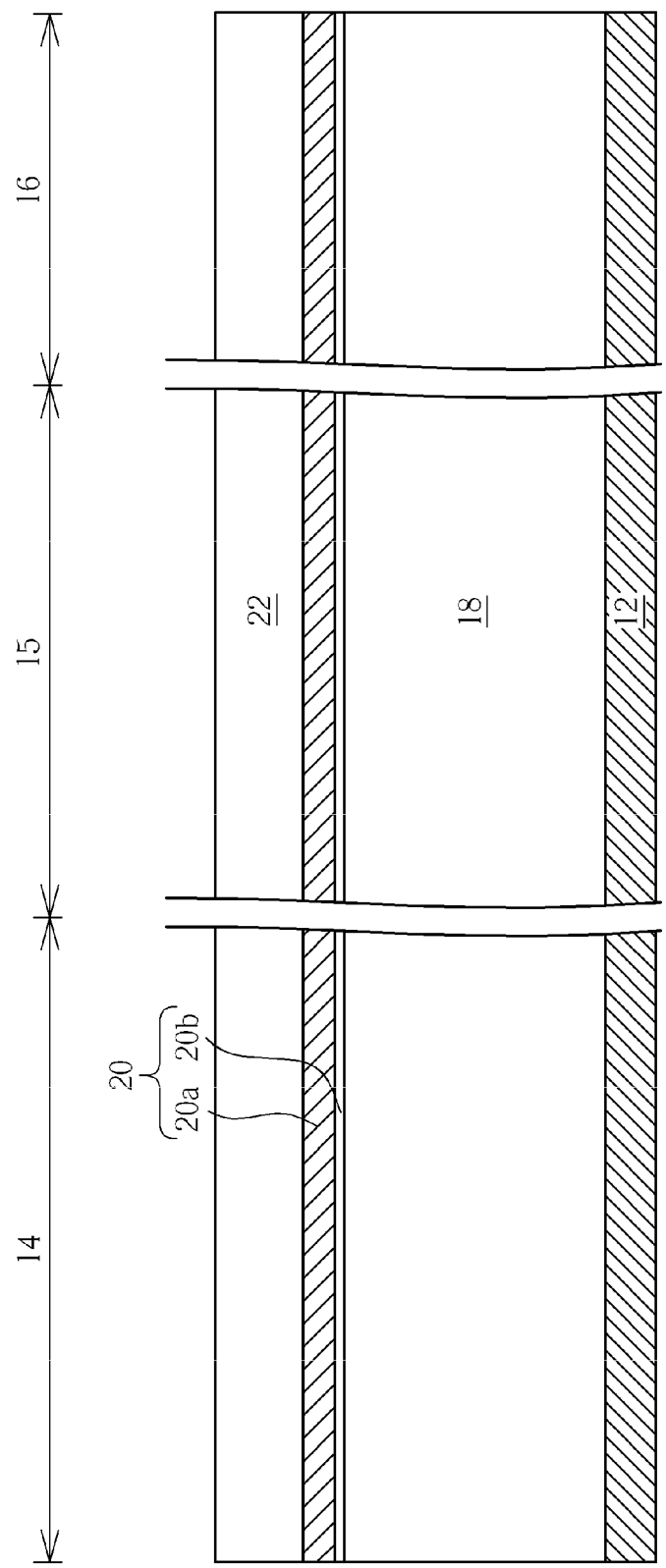
FIGS. 1-16 are schematic, cross-sectional diagrams illustrating a method for fabricating a semiconductor power device in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Please refer to FIGS. 1-16. FIGS. 1-16 are schematic diagrams illustrating a method for fabricating a semiconductor power device in accordance with the embodiment of the present invention, wherein a trench type power device is an exemplary embodiment suitable for the present invention.

As shown in FIG. 1, in a preferred embodiment of this invention, a substrate 12 of a first conductivity type is provided which is an N+ silicon substrate and functions as a drain electrode of the semiconductor device. A cell region 14, termination region 16 surrounding the cell region 14, and a transition region 15 disposed between the cell region 14 and the termination region 16 are defined in the substrate 12. The cell region 14 is used to accommodate a semiconductor device and the termination region 16 comprises a voltage sustaining structure which can function as a barrier for preventing the spreading of the high intensity electric field generated from the cell region 14. Then, an epitaxial layer 18 of the first conductivity type is disposed on the substrate 12 through an epitaxial process. According to the embodiment of the invention, the epitaxial layer 18 of the first conductivity type can be an epitaxial layer doped with N−; for example, the epitaxial layer 18 of the first conductivity type can be formed by a CVD process or any other proper methods and the epitaxial layer 18 of the first conductivity type can function as a drift layer in the power device. A pad layer 20 which can be divided into two parts is formed on the epitaxial layer 18 of the first conductivity type. The composition of an upper pad layer 20a may be $Si_3N_4$ and the composition of a lower pad layer 20b may be $SiO_2$. Then, a hard mask 22, e.g. silicon oxide layer, is formed on the surface of the pad layer 20 by a deposition process.

Figure 2:
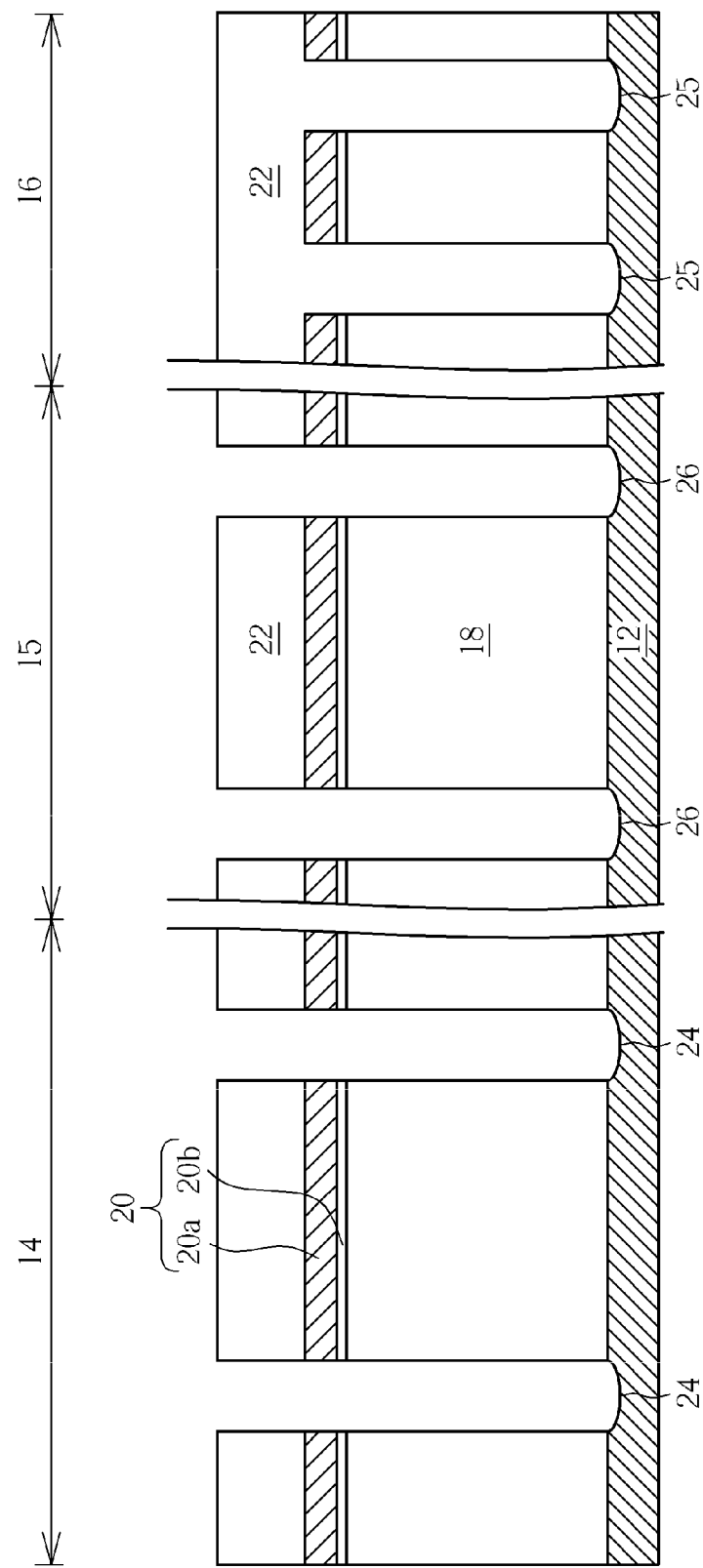

As shown in FIG. 2, a photolithography and an etching process is carried out to etch a plurality of trenches 24, 25, 26 into the hard mask 22, pad layer 20, and epitaxial layer 18 in sequence while the trenches 24, 26, 25 are disposed in the cell region 14, the transition region 15, and the termination region 16, respectively. Depending on different engineering demands, the bottom of the trenches 24, 25, 26 can be located in epitaxial layer 18 or in the substrate 12. For instance, the formation of the trenches 24, 25, 26 can be in the following sequence: A photoresist layer coated on the hard mask 22 is treated with a photolithography process in order to define the location of the trenches. An anisotropic etching process, which uses a patterned photoresist as an etching mask, is performed to transfer the pattern of the patterned photoresist into the hard mask 22 and pad layer 20. The removal of the patterned photoresist is performed followed by a dry etching process, thereby further transferring the pattern into the epitaxial layer 18. The above mentioned method for forming the trenches is only exemplary and the trenches 24, 25, 26 can be fabricated by other methods. In addition, the shape, location, width, depth, length, and number of the trenches are not limited to the trenches 24, 25, 26 shown in FIG. 2. The trenches 24, 25, 26 could be modified for design purposes or manufacturing demands; for instance, the layout of the trenches 24, 25, 26 can be in the form of strips, hexagons, or a spiral-pattern.

Figure 3:
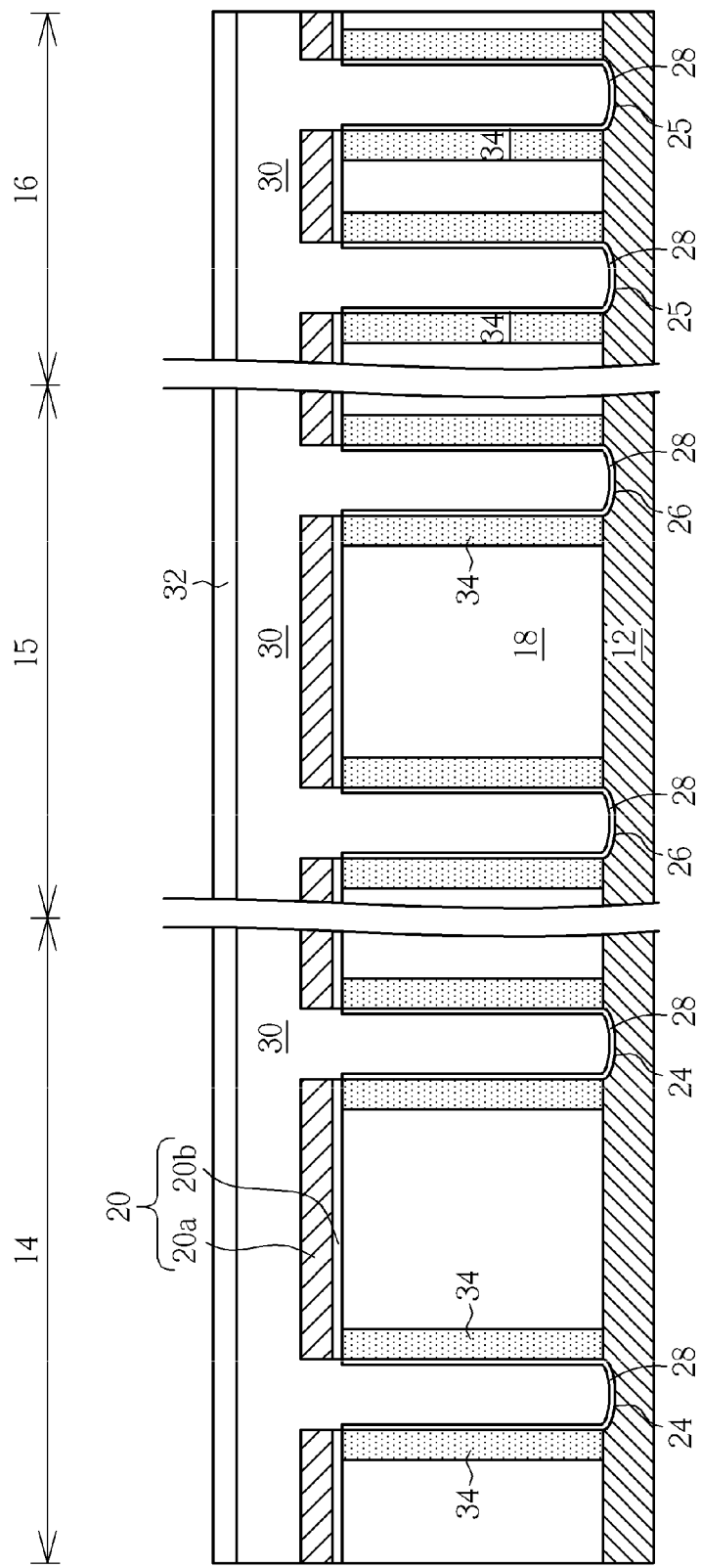

As shown in FIG. 3, the hard mask 22 is removed and a thermal oxidation process is performed to form a buffer layer 28 on the interior surface of the trenches 24, 25, 26. The buffer layer 28 comprising silicon oxide may have a thickness less than 30 nm. It is not recommended to adopt oxynitride or nitride material in the buffer layer as oxynitride may create defects for trapping electrons and nitride materials may impose stress on an interface. Then, a dopant source layer 30 which has the second conductivity type, e.g. P-type, is disposed on the surface of the pad layer 20 and fills up the trenches 24, 25, 26. The composition of the dopant source layer 30 may be borosilicate glass, BSG, but is not limited thereto. The dopant source layer 30 comprising oxide is disposed on the surface of the dopant source layer 30 followed by a thermal drive-in process to diffuse dopants inside the dopant source layer 30 into the epitaxial layer 18. Therefore, a body diffusion region 34 is formed surrounding the trenches 24, 25, 26 in the epitaxial layer 18. As a consequence, a plurality of vertical PN junctions is formed in the epitaxial layer 18, the structure of which is called a super junction.

It is worth noting that buffer layer 28 is capable of repairing the sidewall of the trenches 24, 25, 26 and can improve a contact between the dopant source layer 30 and the trenches 24, 25, 26. As a result, dopants inside the dopant source regions can diffuse into the epitaxial layer 18 in the well concentration distribution and the depth of all diffused dopants will be approximately the same, therefore forming a smooth PN junction. In sum, buffer layer 28 can improve the concentration uniformity of the dopants in the epitaxial layer 18 which effectively solves the drawbacks of the rough PN junction associated with the prior art.

Figure 4:
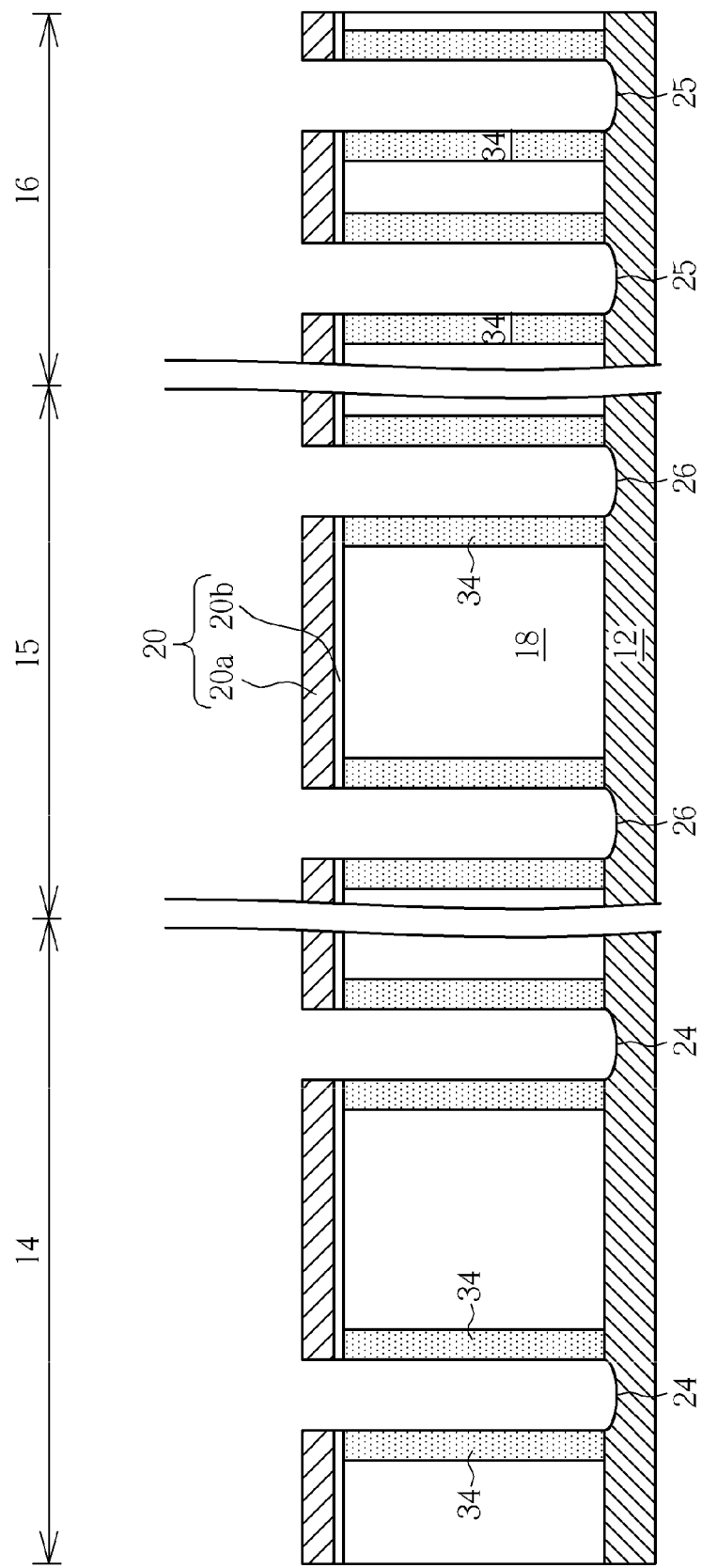

As shown in FIG. 4, the removal of the cap oxide 32, the dopant source layer 30, and the buffer layer 28 are performed to expose the upper surface of the pad layer 20 and the sidewall of the trenches 24, 25, 26. In addition, according to another embodiment of this invention, after forming the body diffusion region 34, only the cap oxide 32 and the dopant source layer 30 are removed or only the cap oxide 32 is removed. The benefit of the removal of the buffer layer 28 is that the dopant source layer 30 can be removed completely hence the occurrence of residues existing in the trenches can be prevented.

Figure 5:
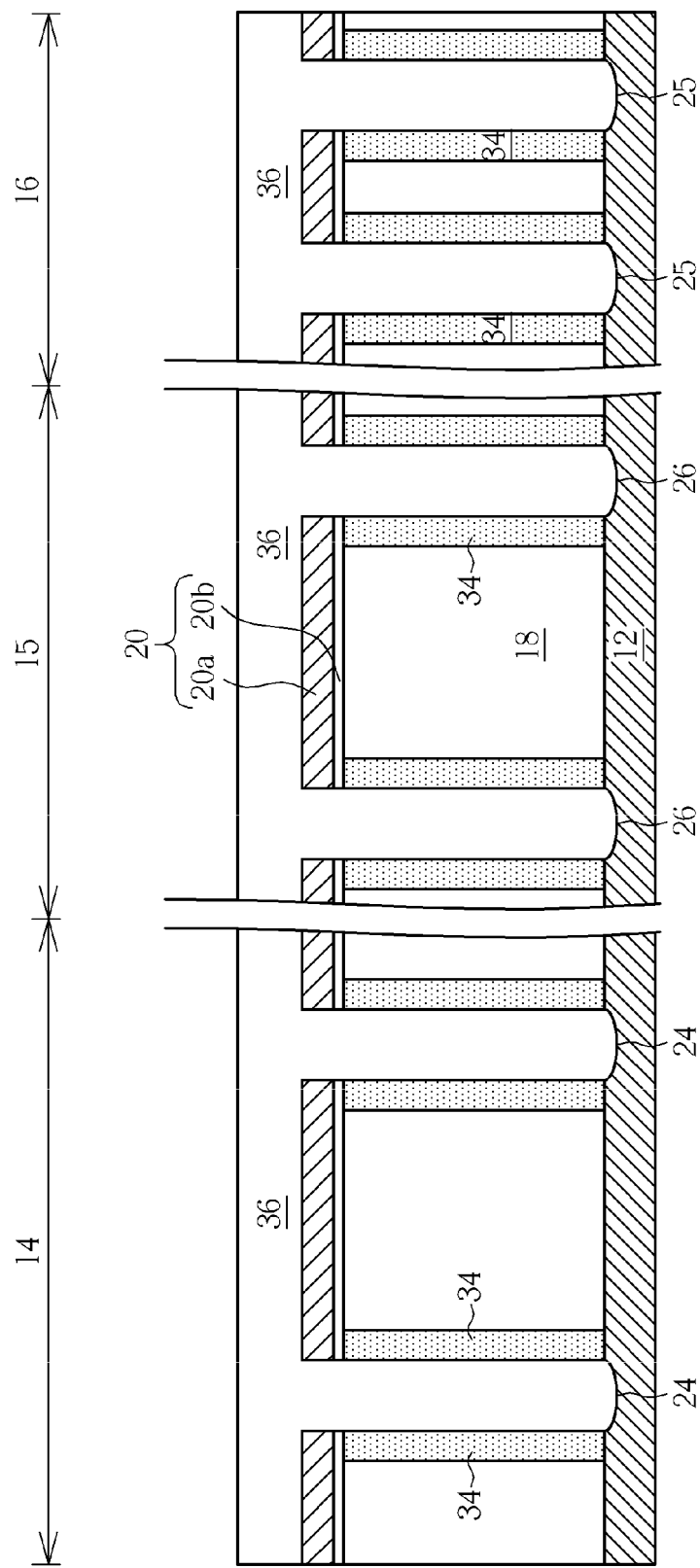
Figure 6:
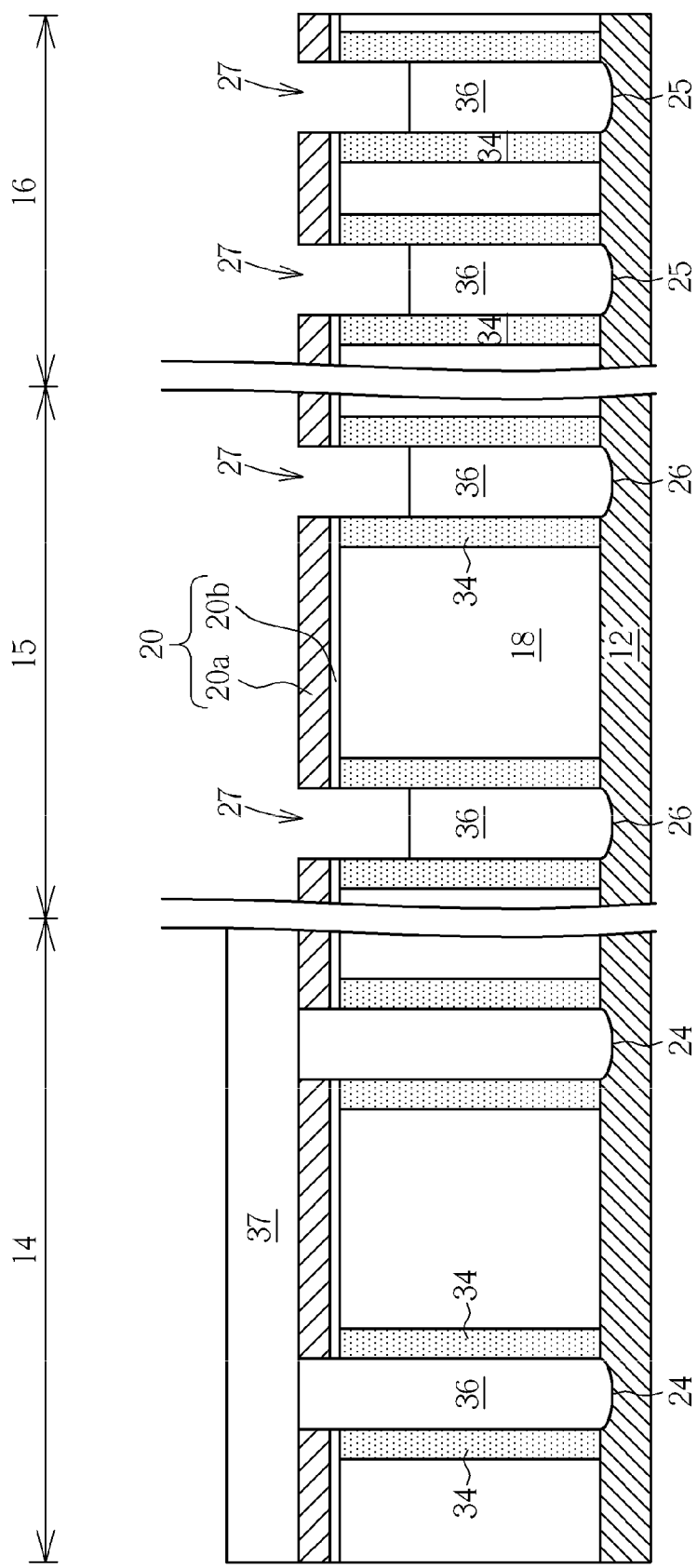

As shown in FIG. 5, a first dielectric layer 36 is formed on the surface of the pad layer 20 and fills up the trenches 24, 25, 26. A CMP process is performed to expose the upper surface of the pad layer 20. As shown in FIG. 6, a photolithography process is carried out to form a patterned photoresist which covers the cell region 14. An etching process is performed to etch regions which are not covered by the photoresist, i.e. the transition region 15 and the termination region 16. At this time, a portion of the first dielectric layer 36 inside the trenches, 26, 25 within the transition region 15 and the termination region 16, respectively, are removed. As a consequence, the upper part of the trenches, 25, 26 is exposed therefore forming a recessed structure 27.

Figure 7:
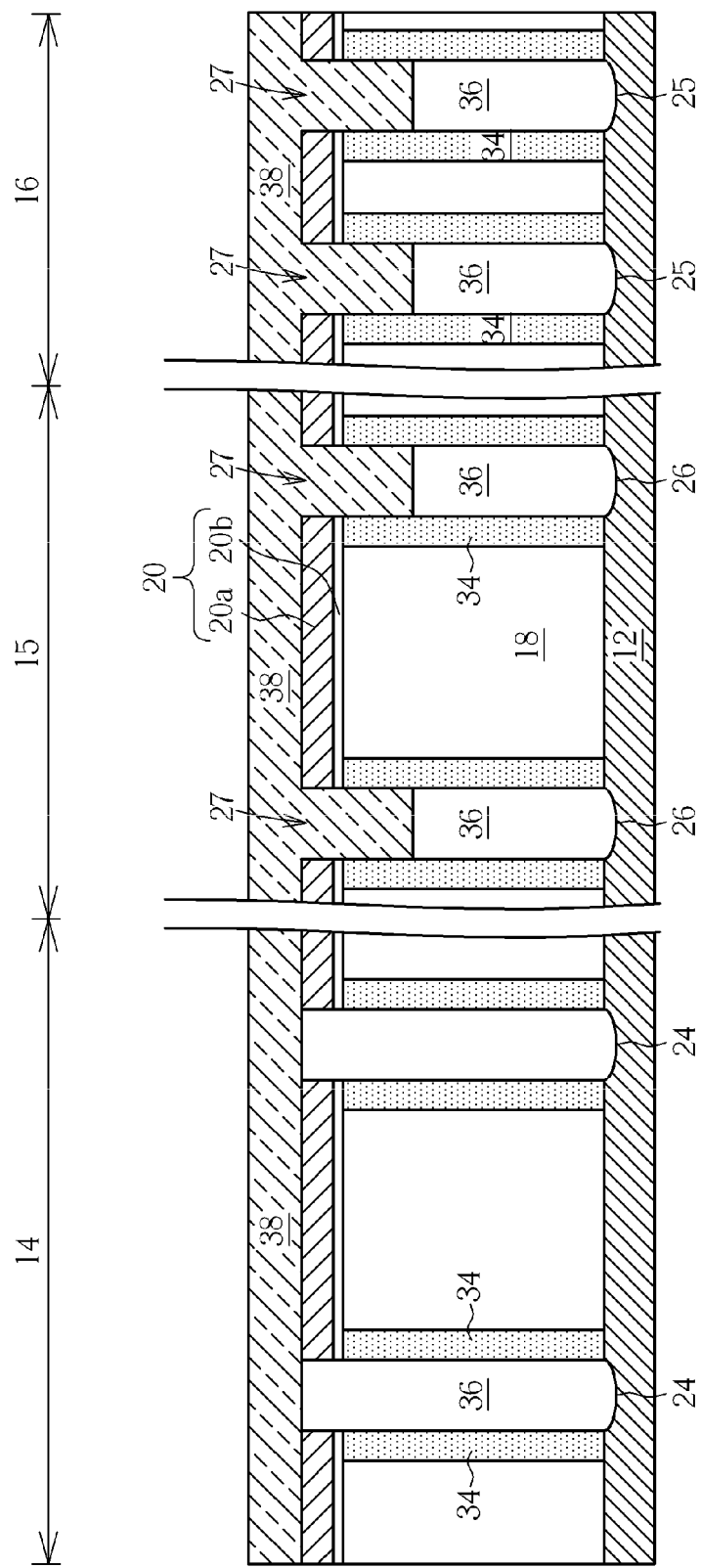

As shown in FIG. 7, the photoresist layer 37 within the cell region 14 is removed. A polysilicon deposition process is performed to form a polysilicon layer 38 within cell region 14, the transition region 15, and the termination region 16. The recessed structure 27 within the transition region 15 and the termination region 16 is filled up by the polysilicon layer 38. Dopants are implanted into the polysilicon layer 38 to improve the conductivity of polysilicon layer 38 and to make the polysilicon layer 38 to be the second conductivity type. In other embodiments, the polysilicon layer 38 can be replaced by Ti, Ti/TiN, Al or other metals.

Figure 8:
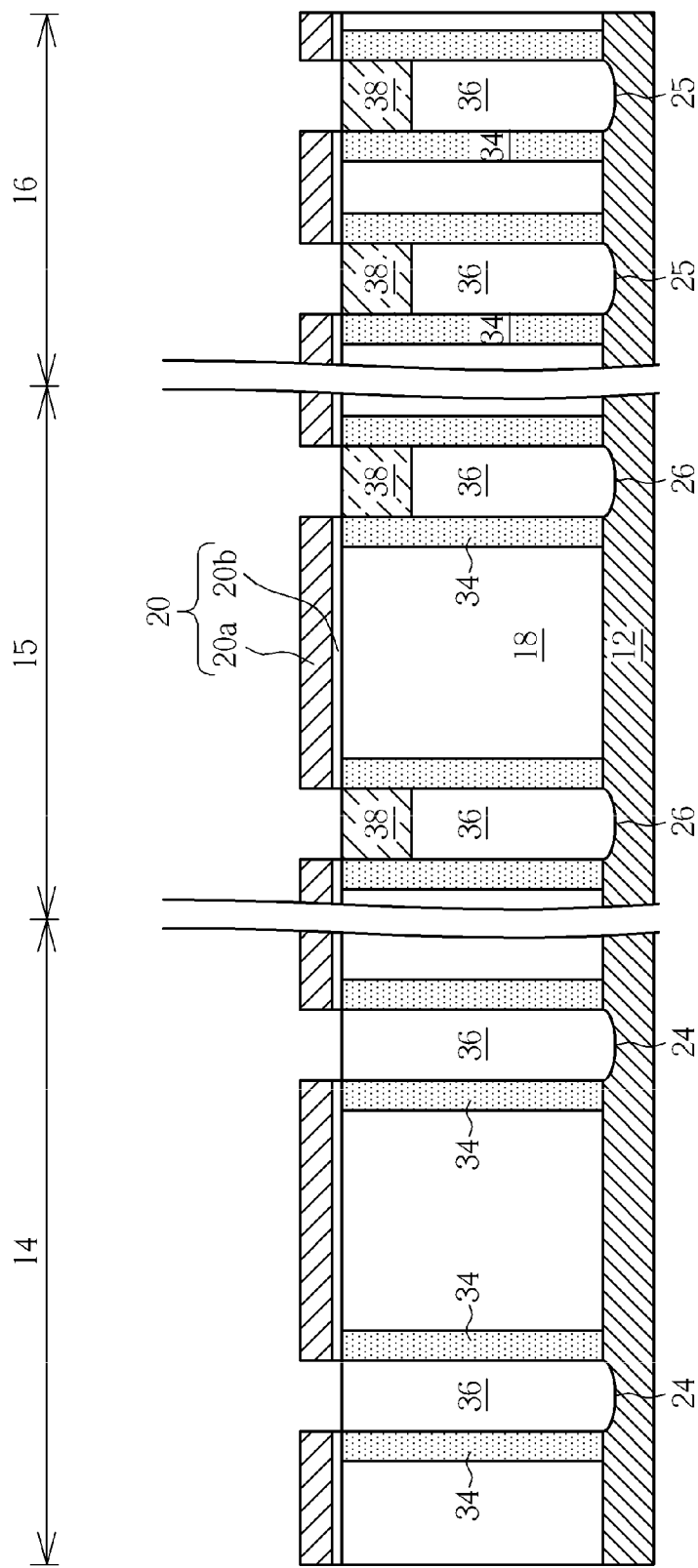

As shown in FIG. 8, a CMP process is carried out to expose the top surface of the pad layer 20. Then, a portion of the first dielectric layer 36 within the cell region 14 and a portion of the polysilicon layer 38 within the transition region 15 and the termination region 16 are etched away until the top surface of the first dielectric layer 36 and the polysilicon layer 38 are level with the top surface of the epitaxial layer 18.

Figure 9:
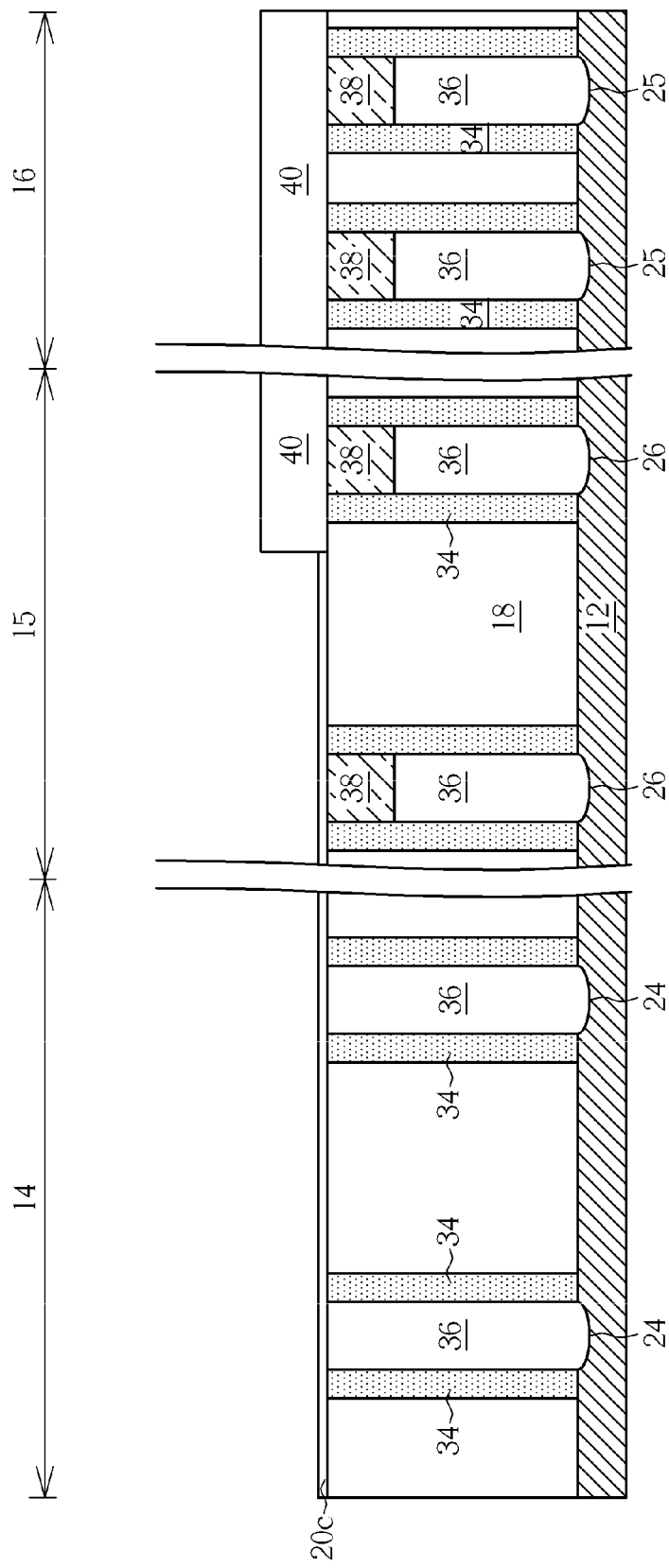

As shown in FIG. 9, the upper pad layer 20a and the lower pad layer 20b are removed to expose the epitaxial layer 18. A field oxide layer 40 comprising silicon oxide is formed on the surface of the epitaxial layer 18 within the transition region 15 and the termination region 16 via conventional deposition and etching process. Then, a sacrificed oxide layer 20c is formed on the surface of the epitaxial layer 18.

Figure 10:
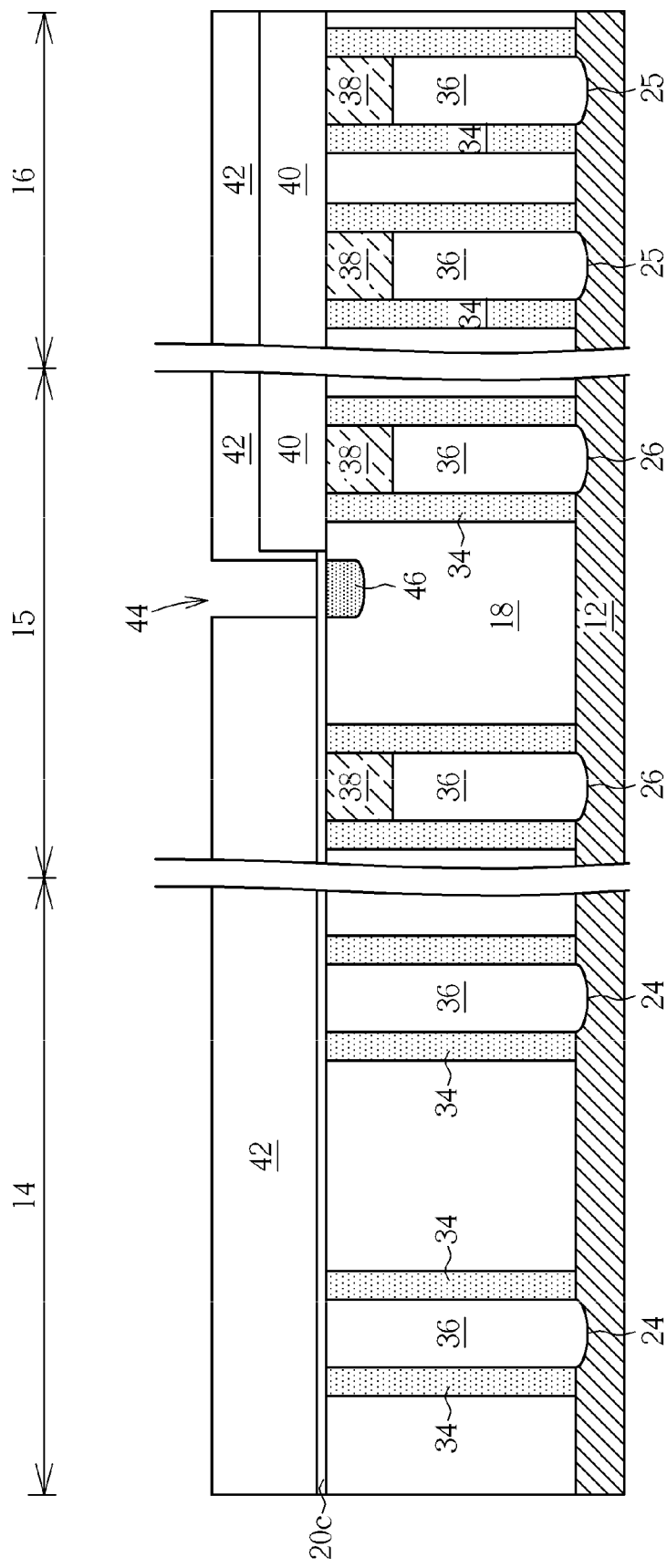

As shown in FIG. 10, a photolithography process is performed to form a photoresist pattern 42 which comprises a hole 44 exposing part of the sacrificed oxide layer 20c. The function of the hole 44 is to define the location of a guard ring. The heavily doped region 46 is formed by an ion implantation process which implants dopants into the epitaxial layer 18 through the hole 44. In the preferred embodiment of the invention, the heavily doped region 46 has the second conductivity type, e.g. P-type.

Figure 11:
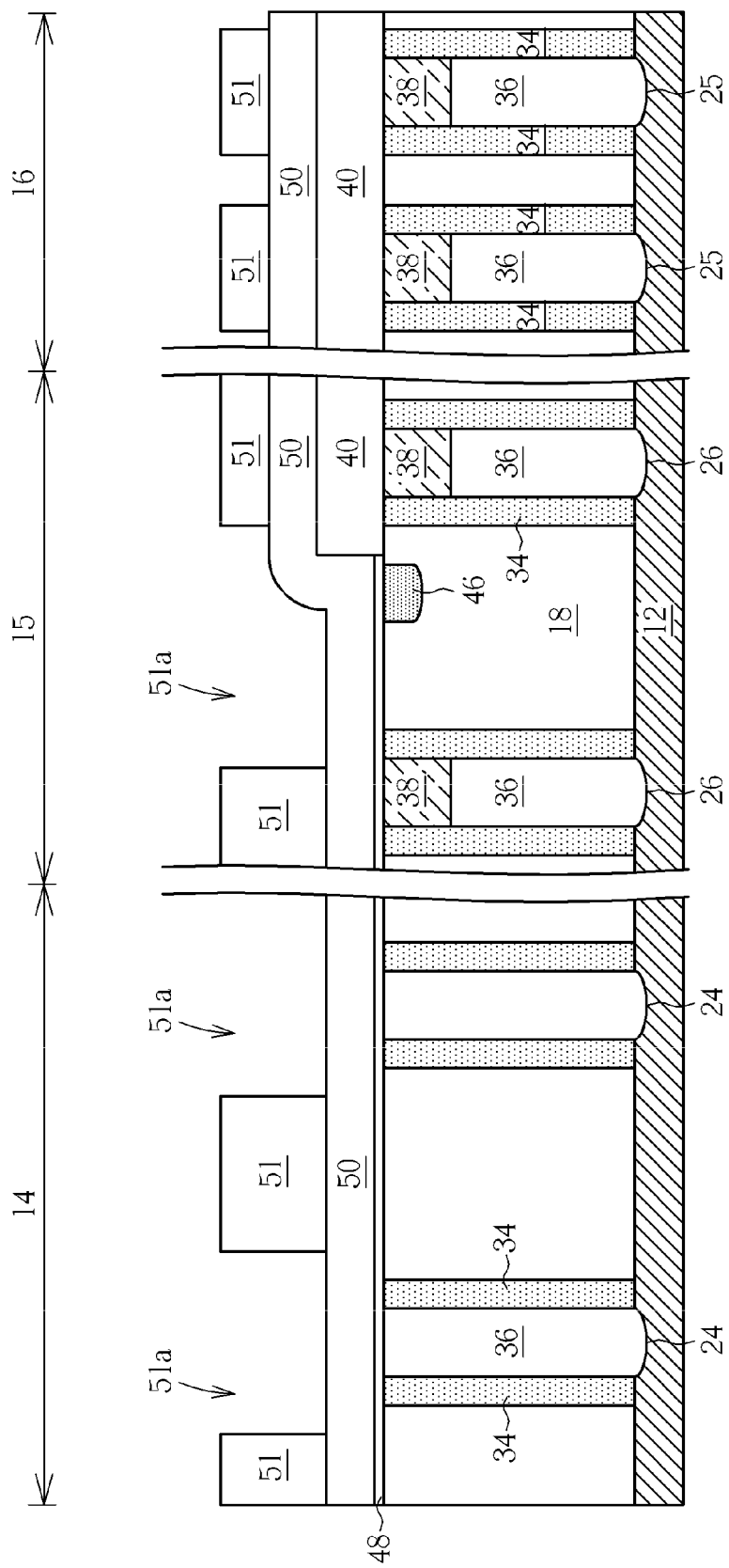

As shown in FIG. 11, the photoresist pattern 42 is removed and a drive-in process is performed to activate the dopants inside the heavily doped region 46. The sacrificed oxide layer 20c (not shown) is removed to expose the upper surface of the epitaxial layer 18. A gate oxide layer 48 is formed on the exposed surface of the epitaxial layer 18 within the cell region 14 and the transition region 15. Then, a gate conducting layer 50 is formed. According to the preferred embodiment of the invention, the gate conducting layer 50 may comprise doped polysilicon. A photolithography process is performed to form a photoresist pattern 51, which comprises a plurality of openings 51a, to expose a portion of the gate conducting layer 50.

The photoresist pattern 51 can be further transferred into the gate conducting layer 50 by an additional process.

Figure 12:
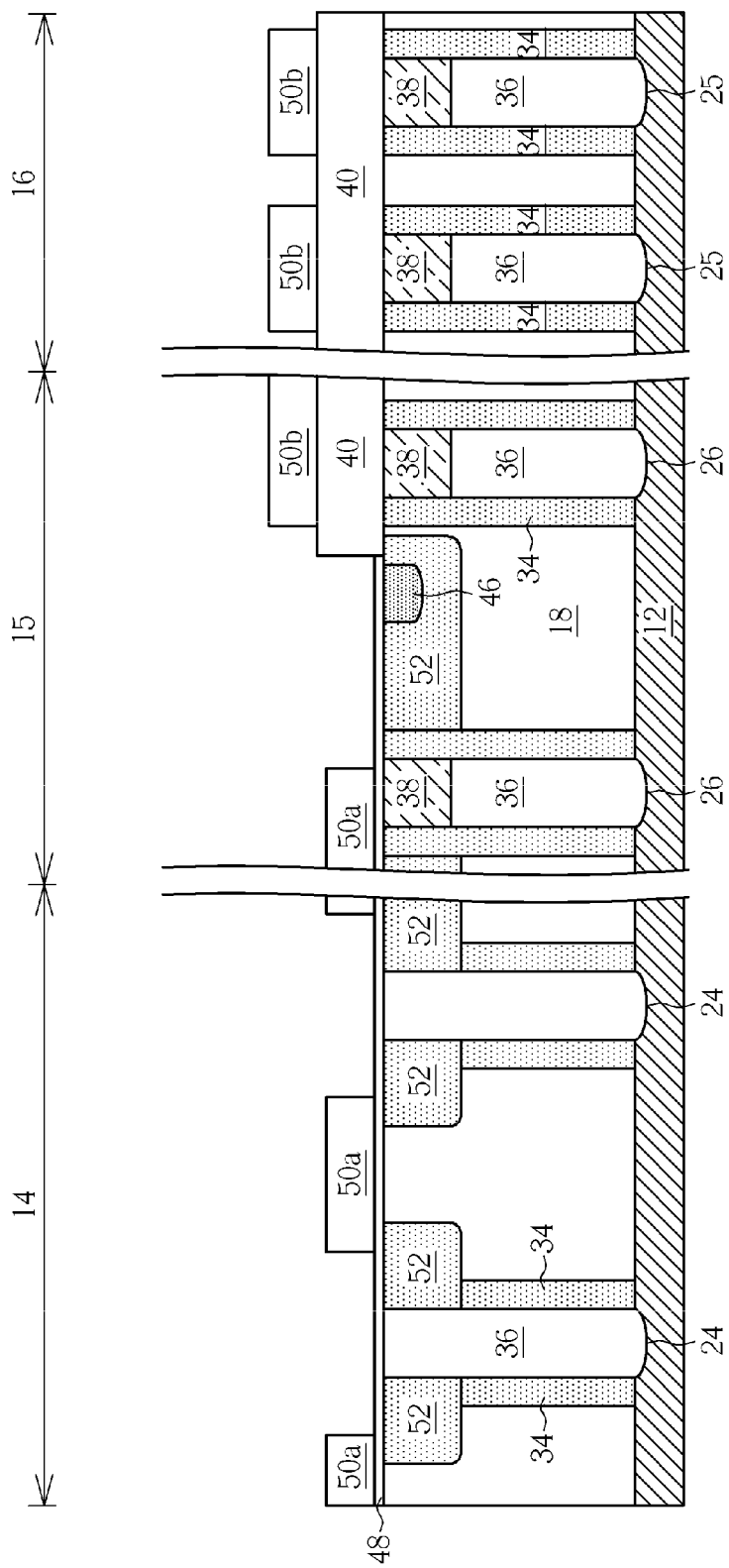

As shown in FIG. 12, by performing an etching process, a part of the gate conducting layer 50 can be etched away through the opening 51a (not shown) to form gate pattern 50a, 50b. The gate pattern 50a and the gate pattern 50b are disposed above the gate oxide layer 48 and the field oxide layer 40, respectively. Then, a self-aligned ion implantation process is performed to form a ion well 52 of the second conductivity type, e.g. P-type well, while the ion well 52 is beside the trenches 24, 26 in the epitaxial layer 18. A drive-in process can further be carried out.

Figure 13:
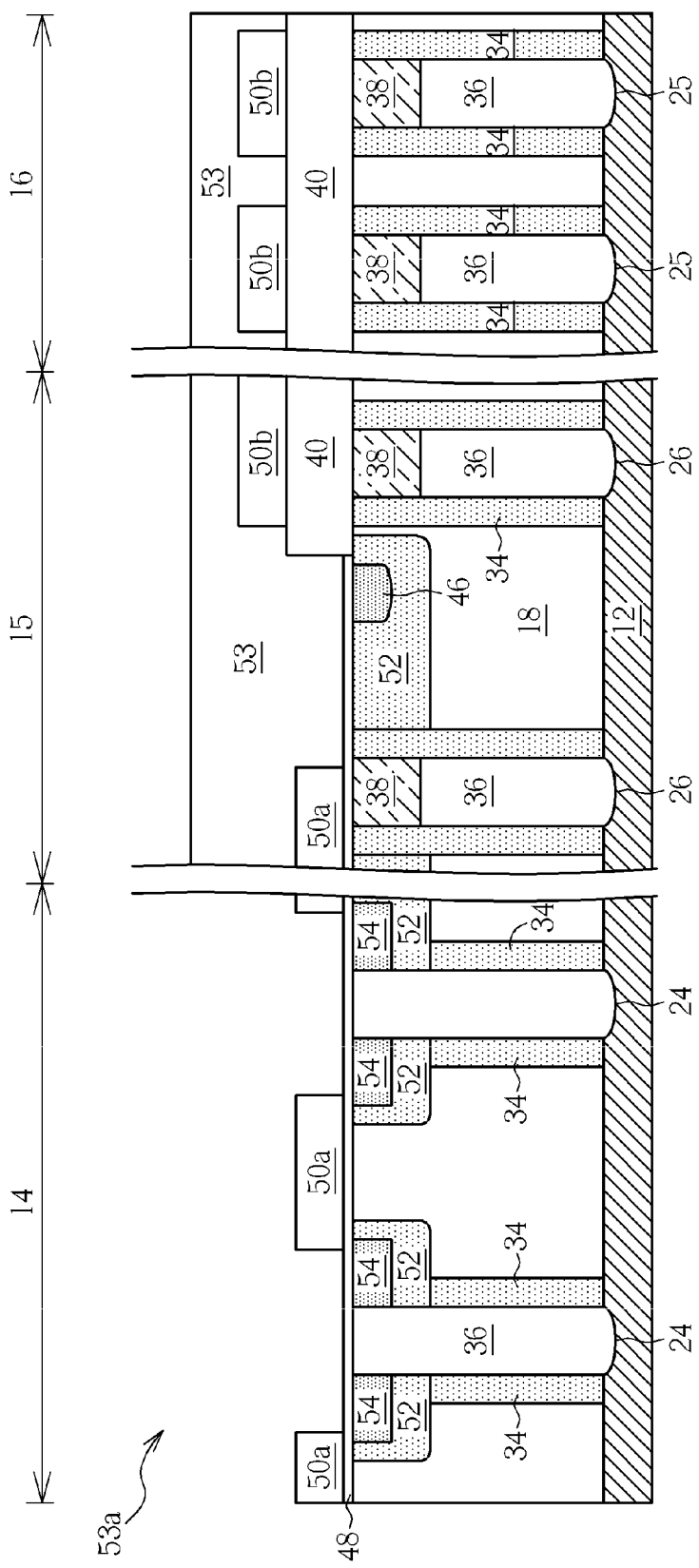

As shown in FIG. 13, a photoresist layer 53 is formed to expose the cell region 14 by a photolithography process. Another ion implantation process is performed to form a source doping region 54 of the first conductivity type in the ion well 52 within the cell region 14. During the ion implantation process, there is no doping region within the transition region 15 and the termination region 16 that are covered by the photoresist layer 53. Then, the photoresist layer 53 is removed and a drive-in process is performed to activate dopants in the source doping region 54.

Figure 14:
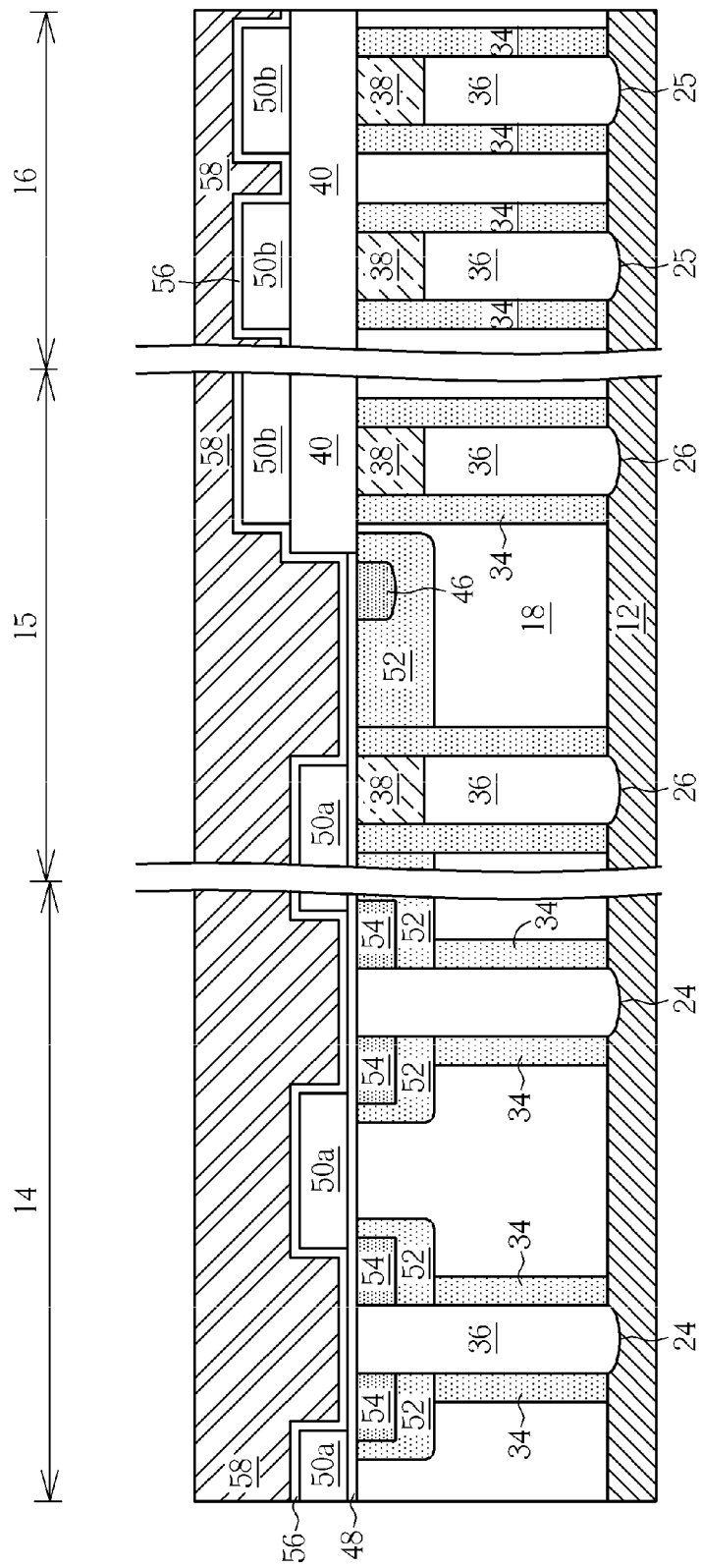

As shown in FIG. 14, a liner 56 and a second dielectric layer 58 are disposed sequentially on the surface of the cell region 14, transition region 15, and termination region 16. According to the preferred embodiment of the invention, the second dielectric layer 58 may comprise BPSG. A reflow and/or etching back process may be applied to planarize the surface of the second dielectric layer 58.

Figure 15:
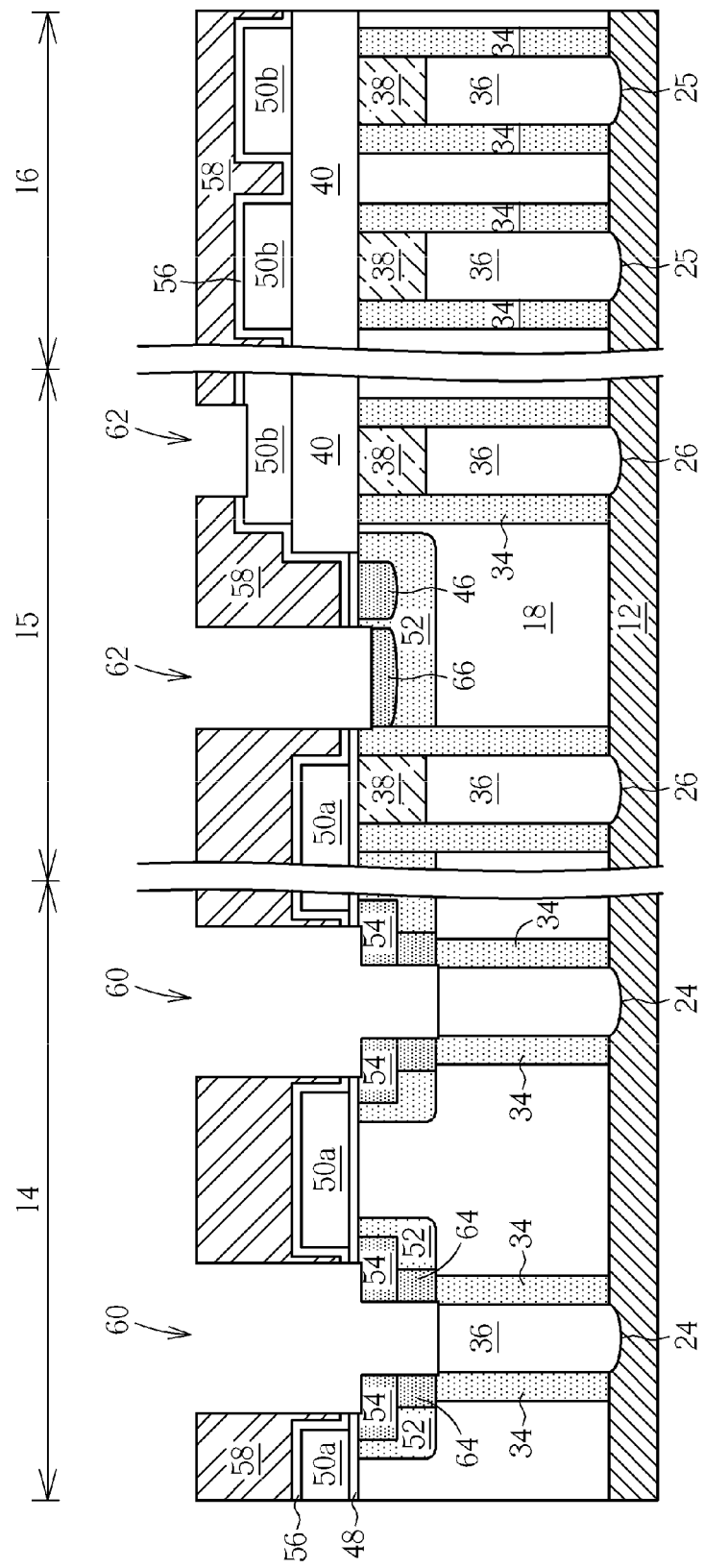

As shown in FIG. 15, by performing a photolithography and an etching process, a portion of the second dielectric layer 58 and a portion of the liner 56, which are within the cell region 14 and the transition region 15, are etched away to form a contact opening 60 which corresponds to each trench 24 in the cell region 14. Therefore, the first dielectric layer 36 inside the trenches 24 and a portion of the source doping region 54 are exposed. At the same time, a contact opening 62 is formed above the ion well 52 and the gate pattern 50b within the transition region 15. Then, a doping region 64 of the second conductivity type is disposed under the source doping region 54 by an ion implantation process. In addition, the doping region 64 is in contact with the source doping region 54. The ion implantation can form a doping region 66 of the second conductivity type in the upper portion of the exposed ion well 52 within the transition region 15. Through the above mentioned ion implantation process, the conductivity of the gate pattern 50b can be increased and the resistance between the gate pattern 50b and a metal contact can be reduced.

Figure 16:
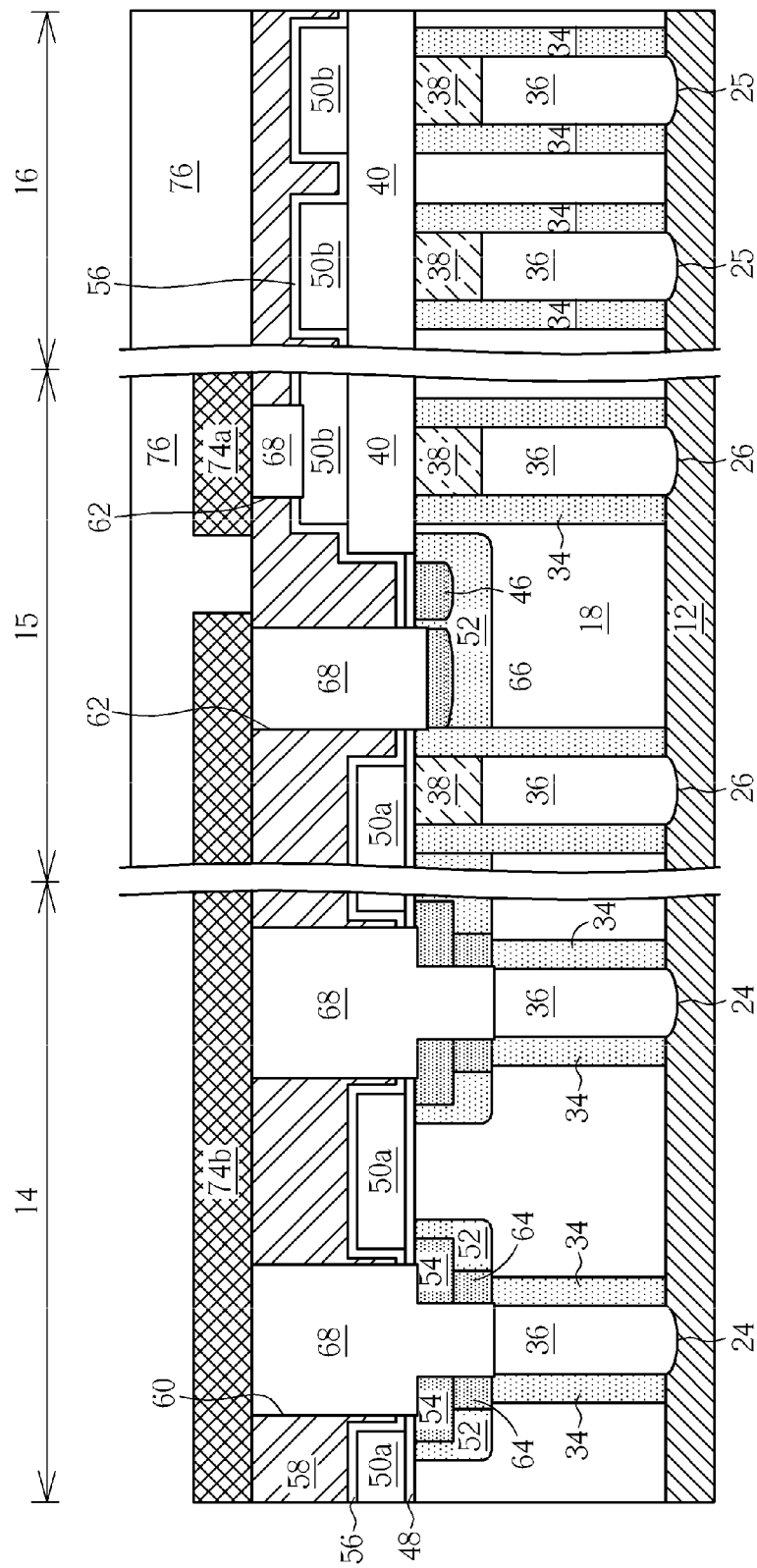

As shown in FIG. 16, a contact plug 68, which may comprise metal, e.g. tungsten or copper etc., is formed inside each contact opening 60, 62. A glue layer and/or a barrier layer may be formed before the filling of the metal layer. A conductive layer (not shown) which may comprise metal, e.g. titanium, aluminum, but is not limited thereto, is formed above the contact plug 68 and the second dielectric layer 58. Another photolithography process is performed to remove a part of the conductive layer (not shown), thereby forming at least a gate wire 74a and at least a source wire 74b. The gate wire 74a and the source wire 74b directly contact and cover the contact plug 68 within the transition region 15 and the cell region 14. A protecting layer 76, which covers the gate wire 74a but exposes the source wire 74b, is formed within the transition region 15 and the termination region 16. As a result, the power device described above is formed.

To summarize, the present invention provides a buffer layer located between a dopant source layer and the sidewall of trenches which can improve the distribution uniformity of dopants around the trenches after applying a drive-in process. As a result, the diffusion depths of the dopants from the sidewall are almost the same, therefore, smooth PN junctions can be obtained.

Those skilled in the art will readily observe that numerous modifications and alterations of the device and method may be made while retaining the teachings of the invention.

What is claimed is:

1. A method for fabricating a semiconductor power device, comprising:
   providing a substrate of a first conductivity type;
   forming an epitaxial layer of the first conductivity type on the substrate;
   forming a pad layer on the epitaxial layer;
   forming a hard mask on the pad layer;
   etching the hard mask, the pad layer and the epitaxial layer to form at least one trench;
   removing the hard mask;
   forming a buffer layer on an interior surface of the trench;
   filling the trench with a dopant source layer comprising dopants of a second conductivity type; and
   performing a drive-in process to diffuse the dopants from the dopant source layer into the epitaxial layer through the buffer layer, thereby forming a body diffusion region of the second conductivity type.

2. The method for fabricating a semiconductor power device according to claim 1 wherein the substrate is an N+ doped silicon substrate and functions as a drain electrode of the semiconductor power device.

3. The method for fabricating a semiconductor power device according to claim 2 wherein the epitaxial layer is an N− doped epitaxial silicon layer.

4. The method for fabricating a semiconductor power device according to claim 1 wherein the buffer layer is formed by a thermal oxidation method.

5. The method for fabricating a semiconductor power device according to claim 1 wherein the buffer layer comprises silicon oxide.

6. The method for fabricating a semiconductor power device according to claim 1 wherein the buffer layer has a thickness that is less than 300 angstroms.

7. The method for fabricating a semiconductor power device according to claim 1, further comprising:
   after the drive-in process, removing the dopant source layer;
   removing the buffer layer;
   filling the trench with a first dielectric layer;
   removing the pad layer to expose a top surface of the eptaxial layer; and
   forming a gate structure on the top surface of the eptaxial layer.

8. The method for fabricating a semiconductor power device according to claim 7 wherein the dopant source layer comprises borosilicate glass.

9. The method for fabricating a semiconductor power device according to claim 7 wherein the first dielectric layer comprises silicon oxide.

10. The method for fabricating a semiconductor power device according to claim 7, further comprising:
    after forming the gate structure, performing a first ion implantation process to form an ion well of the second conductivity type in the epitaxial layer; and
    performing a second ion implantation process to form a source doping region of the first conductivity type in the ion well of the second conductivity type.

11. The method for fabricating a semiconductor power device according to claim 10, further comprising:
   after the second ion implantation process, covering the top surface of the epitaxial layer with a second dielectric layer; and
   etching away a portion of the second dielectric layer to form a contact opening above the trench, wherein the contact opening exposes the first dielectric layer and a portion of the source doping reigon.

12. The method for fabricating a semiconductor power device according to claim 11, further comprising:
   after forming the contact opening, performing a third ion implantation to form a doping region of the second conductivity type under the source doping region; and
   forming a contact plug in the contact opening.

13. The method for fabricating a semiconductor power device according to claim 12 wherein the doping region of the second conductivity type has a doping concentration that is greater than that of the body diffusion region of the second conductivity type.

14. The method for fabricating a semiconductor power device according to claim 12 wherein doping region of the second conductivity type and the source doping region of the first conductivity type are in contact with the contact plug.

15. The method for fabricating a semiconductor power device according to claim 12, further comprising:
   after forming the contact plug in the contact opening, forming a conductive layer on the second dielectric layer and the contact plug, wherein the conductive layer is in direct contact with the contact plug.

16. The method for fabricating a semiconductor power device according to claim 15 wherein the conductive layer functions as a source electrode of the semiconductor power device.

17. The method for fabricating a semiconductor power device according to claim 1 wherein the first conductivity type is N type and the second conductivity type is P type.

18. The method for fabricating a semiconductor power device according to claim 1, further comprising:
   after the drive-in process, removing the pad layer to expose a top surface of the epitaxial layer; and
   forming a gate structure on the top surface of the epitaxial layer.

* * * * *